United States Patent [19]

Nobuta

[11] Patent Number: 4,651,032

[45] Date of Patent: Mar. 17, 1987

[54] COMPENSATING INTEGRATOR WITHOUT FEEDBACK

[75] Inventor: Yasuo Nobuta, Nishinasuno, Japan

[73] Assignee: Kabushiki Kaisha Toshiba, Kawasaki, Japan

[21] Appl. No.: 657,144

[22] Filed: Oct. 3, 1984

[30] Foreign Application Priority Data

Oct. 11, 1983 [JP] Japan .............................. 58-190343

[51] Int. Cl.[4] ......................... H03K 5/01; G06G 7/18

[52] U.S. Cl. .................................. 307/491; 307/557; 307/240; 328/127; 328/128; 328/162; 330/9

[58] Field of Search .................... 330/9; 328/128, 127, 328/162; 307/491, 557, 240

[56] References Cited

U.S. PATENT DOCUMENTS

| | | | |
|---|---|---|---|
| 3,667,055 | 5/1972 | Uchida | 328/127 |
| 3,879,668 | 4/1975 | Edwards | 328/145 |
| 4,163,947 | 8/1979 | Weedon | 328/128 |
| 4,393,351 | 7/1983 | Gregorian et al. | 328/127 |
| 4,439,693 | 3/1984 | Lucas et al. | 307/353 |
| 4,578,646 | 3/1986 | Maio et al. | 307/491 |

FOREIGN PATENT DOCUMENTS 130608 8/1983 Japan .

*Primary Examiner*—Stanley D. Miller
*Assistant Examiner*—Richard Roseen
*Attorney, Agent, or Firm*—Cushman, Darby & Cushman

[57] ABSTRACT

A compensating integrator includes an integrator and a compensating capacitor. During a compensating period, the capacitor is charged with a voltage related to an error component of an input signal to be integrated. Then during an integrating period, the input signal and the charge on the capacitor are applied to input terminals of opposite polarity of the integrator so that the effects of the error component are cancelled. The integrator is prevented from integrating during a compensating period.

12 Claims, 4 Drawing Figures

INTEGRATING PERIOD

COMPENSATING PERIOD

INTEGRATING PERIOD

COMPENSATING INTEGRATOR WITHOUT FEEDBACK

BACKGROUND OF THE INVENTION

1. Field of the Invention

This invention relates to integrators, and more specifically to compensating integrators.

2. Description of the Prior Art

Integrating circuits are employed in many electronic applications, such as, for example, CT scanners. In CT scanners, one or more X-ray sources are employed with one or more detectors. An integrating circuit is connected to the output of a detector to generate a usable signal.

A problem exists, however, in that even when no X-rays are applied to the detector, it still produces an output signal. This effect introduces errors in the output of the integrator. In other integrator applications, unwanted input currents may also adversely affect the integration operation.

A solution to this problem is taught in U.S. Pat. No. 4,163,947 to Weedon. In this patent, during an autozeroing mode, an integrating capacitor is disconnected from an integrating amplifier. Then the output of the amplifier is employed to charge an error capacitor to a value related to input current errors. The voltage across the capacitor is applied to an amplifier which generates an error current provided to the input of the integrating amplifier during integration to compensate for unwanted input currents.

However, problems also exist with the Weedon circuit. For example, the circuitry is more complex, requiring an additional amplifier as compared to a conventional integrating circuit, thus increasing cost significantly. Also, if the amplifier has a high gain, the range of input currents that may be corrected for is limited.

SUMMARY OF THE INVENTION

The present invention provides a simple solution to these problems in a compensating integrator. In the present invention, a compensating capacitor is connected to a non-inverting terminal of an integrator. An inverting terminal of the integrator receives the signal to be integrated. During compensating periods, the capacitor is connected to the inverting input of the integrator so that a charge develops across the capacitor related to the error signal. Also, during compensating periods, the integrator is prevented from integrating. During integration periods, the charge across the capacitor is applied to the non-inverting terminal of the integrator to compensate for the error signal.

Thus, the need for complex circuitry requiring an additional amplifier is avoided, while a broad range of compensation is provided.

The input signal may be applied to a buffer, such as a current to voltage converter, which, in turn, is connected to the integrator, the compensating capacitor is connected to the output of the buffer during compensating periods.

The integrator may consist of an integrating capacitor connected between the inverting input and output of a differential amplifier. To stop integration during compensating periods, a switch, connected in parallel with the integrating capacitor, may be closed.

The compensating capacitor may be connected to the non-inverting input of the integrator through a resistor.

During compensating periods, the non-inverting input may be directly connected to ground.

BRIEF DESCRIPTION OF THE DRAWINGS

These and other objects and advantages of this invention will become apparent and more readily appreciated from the following detailed description of the presently preferred exemplary embodiment of the invention taken in conjunction with the accompanying drawings, of which.

DETAILED DESCRIPTION OF THE INVENTION

Figure 1:
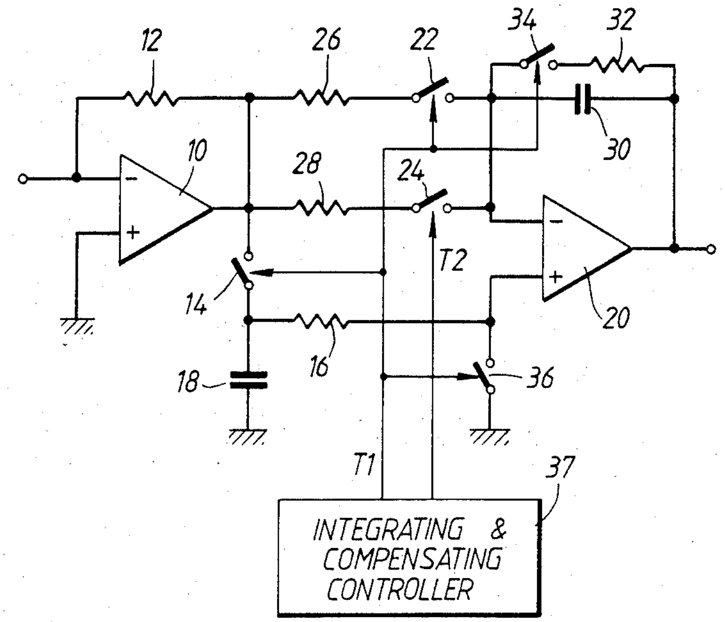
FIG. 1 is a detailed circuit diagram of the present invention.

FIG. 1 shows a circuit diagram representing a preferred embodiment of the invention. As shown in FIG. 1, a current-to-voltage converter includes operational amplifier (OP amp.) 10 having a non-inverting input terminal (+) which is grounded and a negative feedback resistor 12, which is inserted between the output terminal and the inverting input terminal (−) of OP amp. 10. Also, the output terminal of OP amp. 10 is connected through electronic switch 14 to resistor 16 and one side of a correcting capacitor 18. The other side of capacitor 18 is grounded. The output terminal of OP amp. 10 is also connected through resistor 16 to the non-inverting input terminal of OP amp. 20.

Through electronic switches 22 and 24 connected in series, respectively, with resistors 26 and 28, the inverting input terminal of OP amp. 20 is connected to the output terminal of OP amp 10.

Also, the inverting input terminal and output terminal of OP amp. 20 are interconnected through integrating capacitor 30. Resistor 32 exists in order to discharge integrating capacitor 30 and control the gain of OP amp. 20. It is connected in series with electronic switch 34 and that series assembly is connected in parallel with integrating capacitor 30. The non-inverting input terminal of OP amp. 20 is grounded through electronic switch 36. The aforementioned electronic switches 14, 22, 24, 34 and 36 may be semiconductor devices such as FET's or bipolar transistors and may be operated (on-off) according to a predetermined sequence by the control signal from a control device 37. According to the manner in which electronic switches 14, 22, 24, 34 and 36 are operated, the circuit of this example may assume either a compensating mode or an integral mode.

Figure 2:
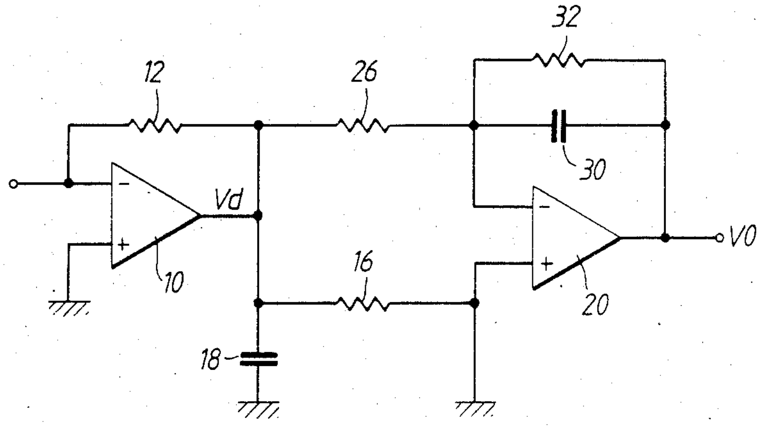
FIG. 2 is an equivalent to the circuit of FIG. 1 during compensating periods.
Figure 3:
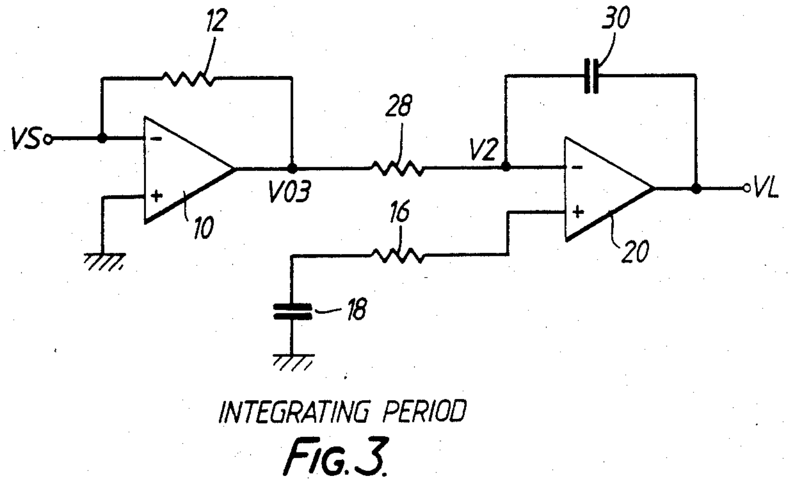
FIG. 3 is an equivalent to the circuit of FIG. 1 during integrating periods.

When electronic switches 14, 22, 34 and 36 are closed or "ON" and electronic switch 24 is open or "OFF", the circuit assumes the compensating mode (FIG. 2). When electronic switch 24 is "ON" and electronic switches 14, 22, 34 and 36 are "OFF", the circuit assumes the integral mode (FIG. 3). For the convenience of explanation, the circuit diagrams of each mode in FIGS. 2 and 3 omit electronic switches and associated components which become electrically isolated because of the "OFF" state of an electronic switch.

Figure 4:
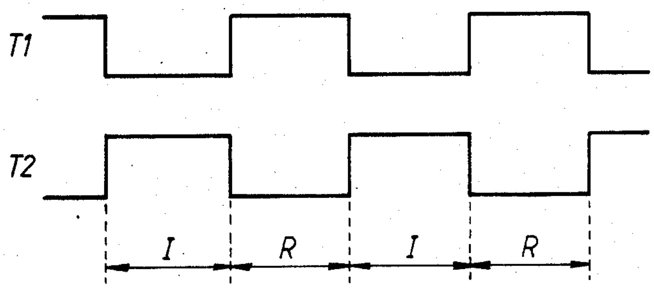
FIG. 4 is a timing diagram useful for explaining the circuit of FIG. 1.

The operations of the compensating mode and the integral mode will be described hereinafter with reference to FIGS. 2–4.

All electronic switches 14, 22, 24, 34 and 36 are controlled by control signals T1 and T2 (see FIG. 4) derived from control device 37. When T1 becomes "HIGH", analog switches 14, 22, 34 and 36 become "ON" and when T2 becomes "LOW", analog switch 24 becomes "OFF". Thus, the auto-zero mode like FIG. 2 (R of FIG. 4) is obtained. In FIG. 2, when a dark current produced by the not-shown detector is input into the inverting input terminal of OP amp. 10, error voltage $V_d$ is generated at the output terminal of OP amp. 10. This error voltage $V_d$ contains the voltage equivalent to the dark current, the offset voltage of OP amp. 10 itself and the bias current of OP amp. 10 itself. Now, the aforementioned dark current is the error current, which the detector produces during its inactive period. Namely, the detector produces this error current while the detector is not subject to X-ray in the CT-system. The aforementioned error voltage $V_d$ is used to charge auto-zero correcting capacitor 18 and at the same time is applied to the inverting input terminal of OP amp. 20 through resistor 26. Error voltage $V_d$, which charges auto-zero correcting capacitor 18 is not applied to the non-inverting input terminal of OP amp. 20, because the latter is grounded. Accordingly, OP amp. 20 forms an inverting amplifier having a gain controlled by resistors 26 and 32. The voltage $V_{o2}$ generated at the output terminal of OP amp. 20 in the compensating mode is as follows.

$$V_{o2} = -\left(1 + \frac{R_{32}}{R_{26}}\right) V_{os} - \frac{R_{32}}{R_{26}} V_d \quad (1)$$

(Where $R_{26}$ and $R_{32}$ are the resistance values of the resistors 26 and 32, respectively and $V_{os}$ is the input offset voltage of OP amp. 20.)

Integrating capacitor 30 discharges through the resistor 32 after the previous integral mode. As a result, electric charge $V_{eo}$ appears between the terminals of integrating capacitor 30. The electric charge $V_{eo}$ is as follows:

$$V_{eo} = V_{o2} + V_{os} = -(R_{32}/R_{26})(V_{os} + V_d) \quad (2)$$

In this condition, the circuit is switched into the integral mode of FIG. 3.

If $T_1$ becomes "LOW", electronic switches 14, 22, 34 and 36 become "OFF" and if $T_2$ becomes "HIGH" level, electronic switch 24 becomes "ON", the integral mode illustrated in FIG. 3 (I of FIG. 4) is assumed. In FIG. 3, the integrated result of only the signal component produced by the not-shown detector appears at the output terminal of OP amp. 20. That is, the error component resulting from the dark current and the offset voltage does not appear. This occurs because the aforementioned error component is input into the differential input terminal and then cancelled there. This will be theoretically proved hereinafter.

At first, the dark current produced by the not-shown detector and the desired signal current component undergo current-to-voltage conversion through OP amp. 10 and the voltage $V_{o3}$ appears at the output terminal of OP amp. 10.

$V_{o3}$ is as follows:

$$V_{o3} = V_s + V_d \quad (3)$$

Here, $V_s$ is the desired signal voltage and $V_d$ is the error voltage, which is derived from the dark current component, the offset voltage of OP amp. 10 etc. Error voltage $V_d$, which has charged correcting capacitor 18 during the previous reset compensating mode is applied to the non-inverting input terminal of OP amp. 20 through resistor 16. Voltage $V_2$ is applied to the inverting input terminal of OP amp. 20 as follows:

$$V_2 = V_d - V_{os} \quad (4)$$

Therefore, the voltage $V_o$ at the output terminal of OP amp. 20 in the integral mode is as follows:

$$V_o = V_d - V_{os} + V_{eo} - \frac{1}{C_{30}} \int \frac{(V_d + V_s) - (V_d - V_{os})}{R_{28}} dt \quad (5)$$

If $R_{26}$ is equal to $R_{32}$ in equation (2), equation (2) becomes as follows:

$$V_{eo} = -(V_{os} + V_d) \quad (6)$$

When equation (6) is applied to equation (5), equation (5) becomes as follows:

$$V_o = -2V_{os} - \frac{1}{C_{30}R_{28}} \int (V_s + V_{os})dt \quad (7)$$

Therefore, error voltage $V_d$ does not appear on the output terminal of OP amp. 20. Accordingly, voltage $V_d$, which contains the dark current from the not-shown detector and the offset voltage of OP amp. 10 etc. may be completely eliminated. $R_{16}$ and $C_{30}$ are the resistance value of resistor 16 and the capacitance of integrating capacitor 30, respectively.

If a small input offset voltage $V_{os}$ is chosen at OP amp. 20, equation (7) becomes as follows:

$$V_o = -\frac{1}{R_{28} \cdot C_{30}} \int V_s dt \quad (8)$$

As shown in equation (8), the ideal integrator, which integrates exactly the desired signal component $V_s$ only, may be composed. After integration is completed during the integral mode, the circuit is turned again to the compensating mode by means of the control signal from the not-shown control device and the aforementioned operation will be repeated.

Thus, by alternating the compensating mode and the integral mode, the error component, which contains the dark current produced by the detector, the offset voltage from OP amp. 10 and 20 etc. may be cancelled and the integration of the desired signal component only becomes possible.

Moreover, the correctable range of the error voltage is wide and the exact integration result can be obtained. This is despite the simple configuration of the few components in the present invention. The savings result from the elimination of the feedback loop employed in the prior art.

Furthermore, the correction may be accurately performed even if the offset voltage of OP amp. 10 drifts, because correcting capacitor 18 receives the correct compensation charge to cancel the aforementioned error component during each compensating mode.

Naturally, this invention is not limited to the aforementioned embodiment and variations may be made within the spirit or scope of this invention.

For example, electronic switches are used in the aforementioned embodiment mainly to prevent switching noise errors, etc. Obviously mechanical switches may be naturally used, when switching noise errors are not a problem. Any device which can perform an on-off operation in response to an external input signal may be employed. Although OP amps. are used in the aforementioned embodiment, any differential amplifying configuration, such as having discrete parts, for example, may also be used. Naturally, any common capacitors may also be employed instead of the integrating capacitor and the correcting capacitor.

Furthermore, in the aforementioned embodiment, the simplified case where resistance value $R_{26}$ of resistor 26 is equal to resistance value $R_{32}$ of resistor 32 has been described. If resistance value $R_{28}$ of resistor 28 is equal to resistance value $R_{26}$ of resistor 26, resistor 26 and electronic switch 22 become useless, because resistors 26 and 28 are in parallel. At the same time, electronic switch 24, i.e. the second switch, becomes useless, because both the compensating mode and the integral mode use resistor 26 in common. Thus, the configuration becomes simpler and the circuit becomes simpler.

All such modifications are intended to be included within the scope of this invention as defined in the following claims.

What is claimed is:

1. A compensating integrator for integrating an input signal having an error component and a data component, comprising:

integrating means having first and second input terminals of opposite polarity and an output terminal, said first input terminal being responsive to said input signal, said integrating means for producing at said integrating means output terminal a signal during an integrating period related to an integral of a difference between signals applied to said first and second input terminals;

a compensating capacitor;

means, coupled between said first input terminal of said integrating means and said compensating capacitor, for selectively charging said compensating capacitor with said error component of said input signal applied to said first input terminal of said integrating means during a compensating period different from said integrating period; and means, coupled between said second input terminal of said integrating means and said compensating capacitor, for selectively applying a voltage on said compensating capacitor to said second input terminal of said integrating means during said integrating period.

2. The integrator of claim 1 further including: a buffer amplifier receiving said input signal and having an output connected to said charging means and a resistor connecting said output of said buffer amplifier to said first input terminal of said integrator.

3. The integrator of claim 2 wherein said buffer amplifier produces an output drift voltage and said compensating capacitor is charged to the drift voltage during the compensating period so that the drift voltage is cancelled during the integrating period.

4. The integrator of claim 2 wherein said buffer amplifier is a current-to-voltage converter.

5. The integrator of claim 1 further comprising means for preventing said integrating means from integrating during said compensating period.

6. The integrator of claim 1 wherein said integrating means includes an operational amplifier having an inverting input terminal and a non-inverting input terminal and a capacitor connected between said output terminal and said inverting input terminal, said first input terminal corresponding to said inverting terminal and said second terminal corresponding to said non-inverting terminal.

7. The integrator of claim 6 further comprising switch means connected between said output terminal and said inverting input terminal, said switch means being closed during said compensating period and open during said integrating period.

8. The integrator of claim 2 wherein said charging means includes switch means connected between said buffer amplifier output and said compensating capacitor, said switch means being closed during said compensating period and open during said integrating period.

9. The integrator of claim 1 further comprising means for disconnecting said input signal from said integrating means during said compensating period.

10. The integrator of claim 2 further comprising switch means connected to said resistor and between said buffer amplifier and said integrating means, said switch means being closed during said integrating period and open during said compensating period.

11. A method of automatically compensating an integrator which integrates during an integrating period and has a first input receiving a signal having an error component and a data component and a second input of opposite polarity, said method comprising the steps of:

charging a compensation capacitor to a value related to said error component of said signal applied to said first input of said integrator during a compensating period different from said integrating period; and applying said value of charge on said compensating capacitor to said second input during said integrating period to compensate for said error component.

12. The method of claim 11 further comprising the step of preventing said integrator from integrating during said compensating period.

* * * * *